(12) United States Patent
Raad

(10) Patent No.: US 9,003,214 B2
(45) Date of Patent: *Apr. 7, 2015

(54) CIRCUIT, SYSTEM AND METHOD FOR SELECTIVELY TURNING OFF INTERNAL CLOCK DRIVERS

(71) Applicant: Conversant Intellectual Property Management Inc., Ottawa (CA)

(72) Inventor: George B. Raad, Boise, ID (US)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/796,677

(22) Filed: Mar. 12, 2013

(65) Prior Publication Data

US 2013/0275799 A1    Oct. 17, 2013

Related U.S. Application Data

(63) Continuation of application No. 12/652,897, filed on Jan. 6, 2010, now Pat. No. 8,412,968, which is a continuation of application No. 11/449,499, filed on Jun. 7, 2006, now Pat. No. 7,669,068, which is a continuation of application No. 10/179,882, filed on Jun. 25, 2002, now Pat. No. 7,089,438.

(51) Int. Cl.

| | |
|---|---|
| G06F 1/00 | (2006.01) |
| G06F 1/26 | (2006.01) |
| G06F 1/32 | (2006.01) |
| G06F 13/28 | (2006.01) |
| G06F 1/04 | (2006.01) |
| G11C 7/20 | (2006.01) |
| G11C 7/22 | (2006.01) |

(52) U.S. Cl.
CPC ............... *G06F 1/04* (2013.01); *G06F 1/3203* (2013.01); *G06F 1/3237* (2013.01); *G06F 1/3275* (2013.01); *G11C 7/20* (2013.01); *G11C 7/22* (2013.01); *G11C 7/225* (2013.01); *G11C 2207/2227* (2013.01); *Y02B 60/1221* (2013.01); *Y02B 60/1225* (2013.01)

(58) Field of Classification Search
None
See application file for complete search history.

(56) References Cited

U.S. PATENT DOCUMENTS

| | | |
|---|---|---|
| 5,355,501 A | 10/1994 | Gross et al. |
| 5,615,376 A | 3/1997 | Ranganathan |
| 5,630,107 A | 5/1997 | Carmean et al. |
| 5,652,733 A | 7/1997 | Chen et al. |

(Continued)

OTHER PUBLICATIONS

Micron Production Data Sheet and Specification, "Synchronous DRAM," pp. 1-54, Micron Technology, Inc., 2000.

*Primary Examiner* — Ji H Bae
(74) *Attorney, Agent, or Firm* — Conversant IP Management Corp.

(57) ABSTRACT

The present invention includes a circuit, system and method for selectively turning off internal clock drivers to reduce operating current. The present invention may be used to reduce power consumption by reducing operating current in a memory device. Operating current may be reduced by turning off internal clock drivers that deliver a clock signal during selected periods of time. According to an embodiment of clock control circuitry of the present invention, an internal clock is disabled if a no operation command is detected during periods of time when no read or write burst operation is taking place. Methods, memory devices and computer systems including the clock control circuitry and its functionality are also disclosed.

15 Claims, 9 Drawing Sheets

(56) References Cited

U.S. PATENT DOCUMENTS

| | | |
|---|---|---|
| 5,752,045 A | 5/1998 | Chen |
| 5,881,016 A | 3/1999 | Kenkare et al. |
| 5,887,178 A | 3/1999 | Tsujimoto et al. |
| 5,918,058 A | 6/1999 | Budd |
| 5,933,649 A | 8/1999 | Lim et al. |
| 6,073,223 A | 6/2000 | McAllister et al. |
| 6,079,025 A | 6/2000 | Fung |
| RE36,839 E | 8/2000 | Simmons et al. |
| 6,138,205 A | 10/2000 | Kawaguchi |
| 6,157,990 A | 12/2000 | Randolph et al. |
| 6,240,048 B1 | 5/2001 | Matsubara |
| 6,300,807 B1 | 10/2001 | Miyazaki et al. |
| 6,407,940 B1 | 6/2002 | Aizawa |
| 6,654,302 B2 | 11/2003 | Hashimoto |
| 6,657,634 B1 | 12/2003 | Sinclair et al. |
| 6,678,832 B1 | 1/2004 | Gotanda |
| 6,772,359 B2 | 8/2004 | Kwak et al. |
| 6,848,058 B1 | 1/2005 | Sinclair et al. |
| 7,073,014 B1 | 7/2006 | Roohparvar |
| 7,089,438 B2 | 8/2006 | Raad |
| 7,107,471 B2 | 9/2006 | Feierbach |
| 2002/0184438 A1 | 12/2002 | Usui |

CIRCUIT, SYSTEM AND METHOD FOR SELECTIVELY TURNING OFF INTERNAL CLOCK DRIVERS

RELATED APPLICATIONS

This application is a continuation of U.S. application Ser. No. 12/652,897, filed Jan. 6, 2010, which is a continuation of U.S. application Ser. No. 11/449,499, filed Jun. 7, 2006, now U.S. Pat. No. 7,669,068, issued Feb. 23, 2010, which is a continuation of U.S. application Ser. No. 10/179,882, filed Jun. 25, 2002, now U.S. Pat. No. 7,089,438, issued Aug. 8, 2006. The entire teachings of the above applications are incorporated herein by reference.

BACKGROUND OF THE INVENTION

There are many reasons why reducing operating current in digital electronics, especially computer systems, is desirable. Portable computer systems, for example, rely on battery power when not plugged into a recharger. By reducing power consumption, batteries will last longer between recharging and the user has more time to perform computing tasks untethered by a power cord. Even desktop computers can benefit from reduced operating current by the cumulative effects of energy consumption, thereby reducing energy needs and related costs to consumers.

At the integrated circuit level, reducing operating current generally reduces power consumption. More importantly, reducing operating current reduces the need for heat dissipation. With an ever-increasing number of transistors on a single integrated circuit (IC) chip, heat dissipation becomes a serious concern because over-heated electronic devices are more likely to fail from thermal breakdown or simply by burning up. The cost of electronic systems increases when the use of heat sinks, fans and other means of cooling is necessary to cool the ICs within.

The prior art has taken a number of approaches to reducing power consumption in digital electronic systems. One conventional approach, common in laptop personal computers, involves shutting down certain functions, e.g., hard drives and displays, after a period of inactivity. This approach typically requires the use of software or hardware timers. Another approach, know as "clock throttling," reduces power consumption by reducing the speed of the clock driving the digital circuitry. Since power consumption is directly related to clock speed, any reduction in clock speed will reduce power consumption.

These prior art approaches suffer from a variety of shortcomings. For example, if functional aspects of a system are temporarily turned off to reduce power consumption, these same functional aspects are not immediately available to the system user. For example, a hard drive that has been shut down may need to spin up for a few seconds in order to be accessed. Such delays can be annoying and waste the user's time. Additionally, such power-reducing schemes implemented in software will consume computational resources. Similarly, where timers are implemented in hardware, additional computer hardware is required, adding to system cost, and may also consume valuable IC real estate. The clock throttling approach directly affects system performance. If a system clock is reduced in half, a given task may take twice as long to perform.

Another conventional approach to reducing power consumption in ICs is disclosed in U.S. Pat. No. Re. 36,839 to Simmons et al. The Simmons et al., patent discloses clock control circuitry coupled to functional blocks. The clock control circuitry activates and deactivates the functional blocks in response to the flow of data within the IC by modulating clock signals distributed to the functional blocks. However, the functional blocks must provide control signals to the clock control circuitry requesting that it and/or its neighbor be activated or deactivated. Additionally, Simmons et al., does not appear to disclose monitoring external (off-chip) signals suitable for selectively turning off internal clock drivers for reducing power consumption in a memory device.

U.S. Pat. No. 5,615,376 to Ranganathan discloses clock management for power reduction in a video display subsystem. According to the Ranganathan patent, a video subsystem reduces power consumption by periodically disabling the video controller clocks used for transferring pixel data to a screen. The video clocks are pulsed only when pixel data is being transferred to the screen, during the time that a horizontal line of pixels is being scanned on the screen. The video clocks are not pulsed during the horizontal and vertical blanking periods, when the electron beam in a cathode-ray-tube is being retraced. The video clocks are also not pulsed during a recovery period for a flat-panel display. However, the Ranganathan patent appears to be tailored to video subsystems and does not appear to disclose monitoring external (off-chip) signals suitable for selectively turning off internal clock drivers for reducing power consumption in a memory device.

Yet another conventional method of reducing power consumption in ICs is disclosed in U.S. Pat. No. 5,918,058 to Budd. Budd discloses routing of clock signals in a data processing circuit with a power-saving mode of operation. The data processing circuit according to Budd comprises a clock generator for generating a clock signal and a plurality of clocked circuit elements. A main bus is arranged to provide the clock signal to the plurality of clocked circuit elements in a first mode of operation and a power-saving bus separate from the main bus arranged to provide the clock signal to a subset of the plurality of the clocked circuit elements in a power-saving mode. The obvious shortcoming with the Budd approach is the necessity for two clock busses. Additionally, Budd does not appear to disclose monitoring external (off-chip) signals suitable for selectively turning off internal clock drivers for reducing power consumption in a memory device.

Thus, there exists a need in the art for a circuit, system and method for selectively turning off internal clock drivers by monitoring external signals suitable for reducing operating current in memory devices.

SUMMARY OF THE INVENTION

The present invention includes a circuit, system and method for selectively turning off internal clock drivers to reduce operating current. Advantages of the circuit, system and method of the present invention include reducing operating current in an IC during idle time. By reducing operating current, power consumption is also reduced, thereby increasing battery life for portable systems relying on battery power. Additionally, by reducing power consumption, cooling requirements are also reduced for ICs including the clock control circuitry of the present invention. The invention is particularly suited for detecting idle time in a memory device such as a dynamic random access memory (DRAM) and turning off internal clocks driving global cells within the memory device or the whole die depending on whether the die is actually performing an active function.

The embodiments of the present invention will be readily understood by reading the following detailed description in conjunction with the accompanying figures of the drawings.

Figure 1:
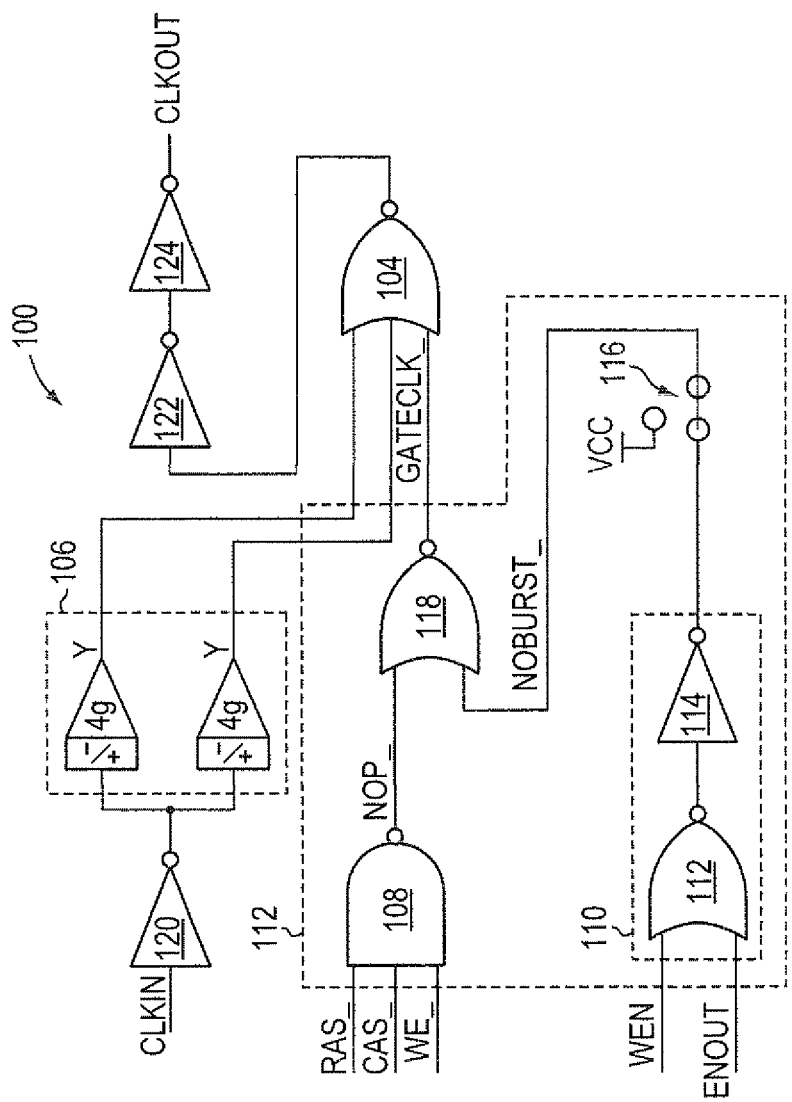
FIG. 1 is a schematic diagram of clock control circuitry in accordance with the present invention.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

This invention relates generally to integrated circuits. In particular, the present invention relates to a circuit, system and method for selectively turning off internal clock drivers to reduce operating current.

A description of example embodiments of the invention follows.

The present invention includes a circuit, system and method for selectively turning off internal clock drivers to reduce operating current. The present invention may be used to reduce power consumption in a memory device. The reduction in power consumption may be obtained by reducing operating current in the memory device. Operating current may be reduced by turning off internal clock drivers that deliver a clock signal during selected periods of time. When internal circuitry does not require a clock signal, there is no need to distribute a clock signal that requires constant switching of transistors.

FIG. 1 is a schematic diagram of clock control circuitry 100 in accordance with the present invention. Clock control circuitry 100 receives a system clock (CLKIN) as an input signal and selectively outputs an internal clock (CLKOUT) for use by other synchronous circuits. Clock control circuitry 100 may include command detection circuitry 102 and clock gating circuitry 104 coupled to said command detection circuitry 102. Clock control circuitry 100 may also include delay circuitry 106 for delaying a system clock to compensate for delays in the command detection circuitry 102.

Command detection circuitry 102 may include any circuitry for monitoring command signal inputs to determine occurrence of an active command, e.g., a read or write command, or, alternatively, if the memory device is to remain idle, e.g., a no operation (NOP) command. As illustrated in FIG. 1, command detection circuitry 102 may include a 3-input NAND gate 108 for sensing an NOP command. During an NOP command, no action or operation takes place in response to command signal inputs. It is desirable to turn off an unneeded internal clock during an NOP command. In a memory device, an NOP command may be sensed by the signals row-address strobe (RAS_), column-address strobe (CAS_) and write enable (WE_) as shown in FIG. 1. The "_" symbol appended to RAS_, CAS_and WE_indicates that the signals RAS_, CAS_and WE_are active low. Of course, one of ordinary skill in the art will recognize that selecting RAS, CAS and WE to be active high or active low is a simple matter of logic design. Thus, the use of active low RAS_, CAS_and WE_is merely exemplary. Three-input NAND gate 108 will output signal NOP_(active low) indicating an NOP command if RAS_, CAS_and WE_are all high.

Command detection circuitry 102 may also include burst detection circuitry 110. Burst detection circuitry 110 detects whether or not a read or write (read/write) burst operation is taking place. While it is desirable to turn off an internal clock during idle time, it is important to distribute an internal clock during read/write burst operations. If a read/write burst operation is taking place, burst detection circuitry 110 provides a signal to clock gating circuitry 104 allowing distribution of a system clock as an internal clock, regardless of the output of 3-input NAND gate 108 and the presence of an NOP command. As shown in FIG. 1, input signals WEN and ENOUT are input to a 2-input NOR gate 112, the output of which feeds an inverter 114 driving signal NOBURST_. Of course, there are other combinations of logic gates logically equivalent to the 2-input NOR gate 112 and inverter 114, e.g., a 2-input OR gate in series with a buffer. Such equivalent combinations of logic gates are within the scope of the present invention and also within the knowledge of one of ordinary skill in the art and, thus, will not be further elaborated.

Command detection circuitry 102 may further include bypass circuitry 116 for selectively bypassing the power conservation feature of the clock control circuitry 100. Bypass circuitry 116 may be a switch (as illustrated) or may be a nonvolatile programmable element such as a fuse or antifuse, or may be a volatile switching element such as a transistor, latch or register, or any other suitable means for setting the value of signal NOBURST_. Command detection circuitry 102 may further include a 2-input NOR gate 118 for receiving signals NOP_and NOBURST_and outputting signal GATECLK_. If signal GATECLK_is held high, output signal CLKOUT will always be held low regardless of levels or edges on input signal CLKIN. Alternatively, if GATECLK_is low, indicating a non-NOP command or a burst operation, pulses on input signal CLKIN will propagate to output signal CLKOUT. Command detection circuitry 102 may further include an input inverter 120 and output inverters 122 and 124 for buffering the input signal CLKIN and output signal CLKOUT, respectively. Output inverters 122 and 124 may be sized to drive an appropriate fan out as known to one of ordinary skill in the art.

Figure 2A:
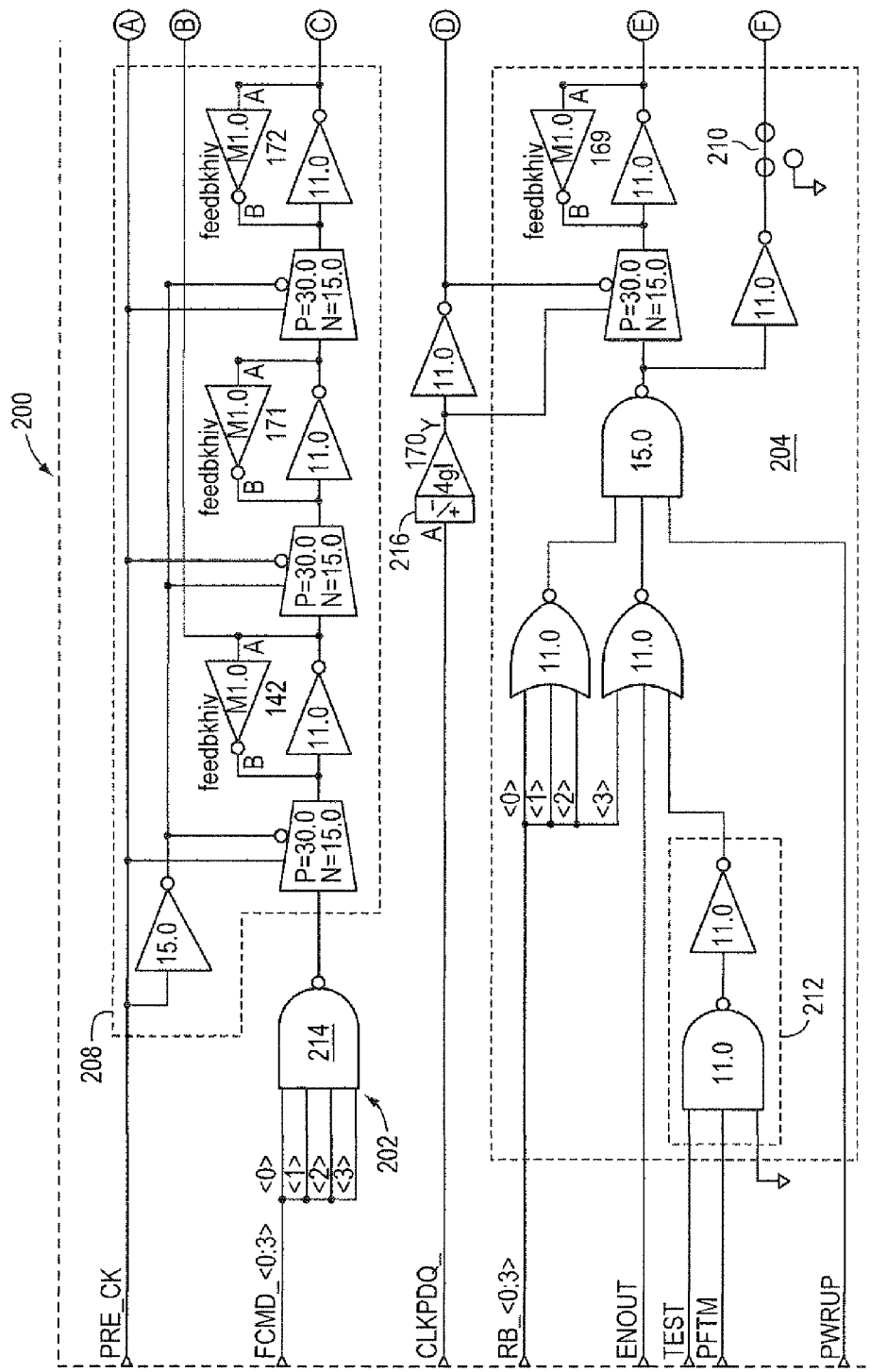
FIGS. 2A-B are schematic diagrams of another embodiment of clock control circuitry according to the present invention.
Figure 2B:
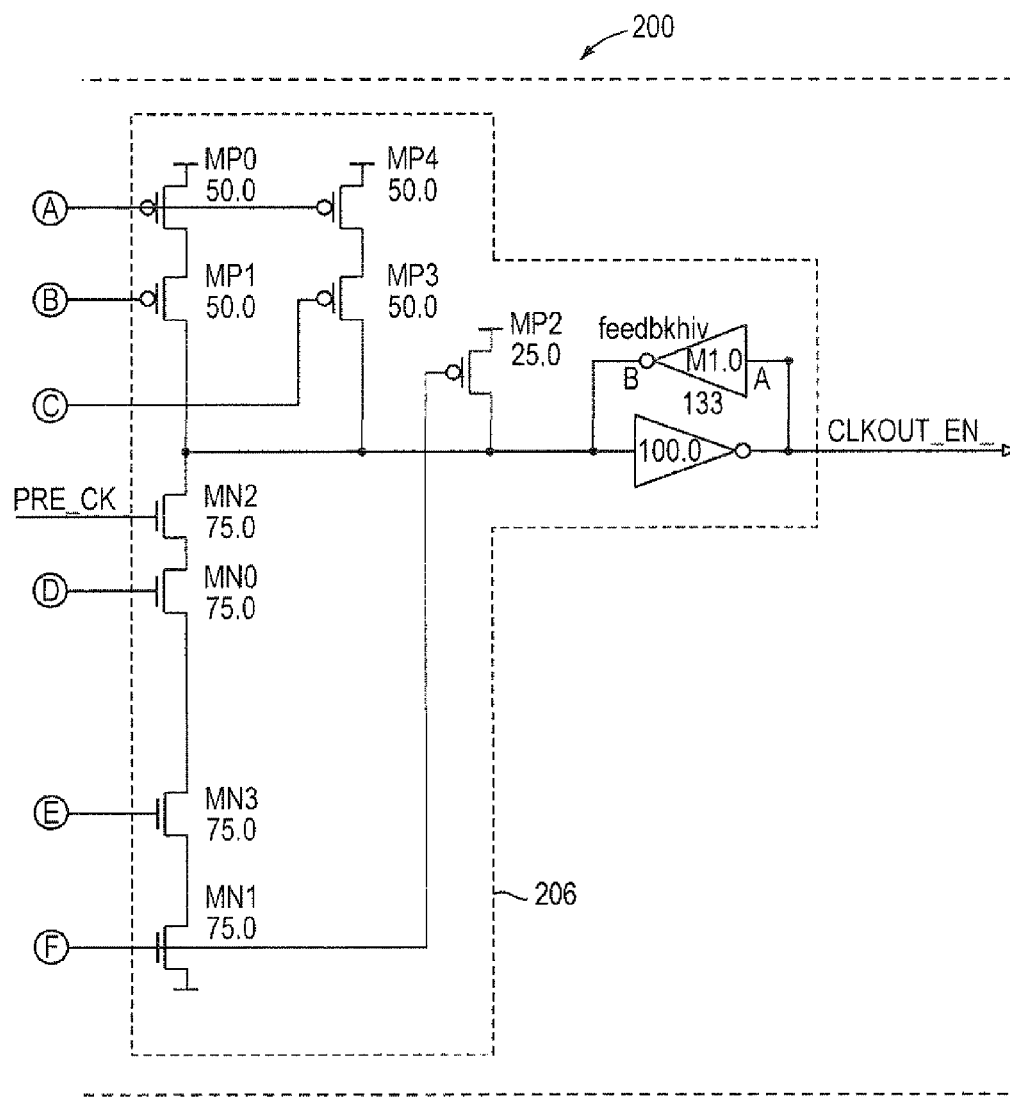

FIG. 2 is a schematic diagram of clock control circuitry 200 according to the present invention. Clock control circuitry 200 may include command detection circuitry 202, burst detection circuitry 204 and clock gating circuitry 206 coupled to the command detection circuitry 202 and the burst detection circuitry 204. The output signal CLKOUT_EN_may be used by other circuitry (not shown in FIG. 2, but see FIG. 3 and related discussion below) to disable distribution of a system clock (not shown) to other internal circuitry during idle time, thereby reducing power consumption.

Input signals to clock control circuitry 200 may include command signals such as FCMD_<0:3>, which may be decoded to determine when an active command or NOP command is present; a preclock signal PRE_CK, which may be used to qualify commands in a register 208 (see below); input clock signal CLKPDQ_, which is indicative of the system clock signal (not shown) that is to be distributed internally or not; register burst control signals such as RB<0:3>, which may be decoded along with an enable out ENOUT signal to determine whether or not a read/write burst operation is being executed. An optional power up PWRUP signal may also be input to clock control circuitry 200 for forcing the output signal CLKOUT_EN_to an on state until a valid power up condition is detected. Additionally, signals TEST and PFTM may be used as spare control signals for test modes. The output signal to clock control circuitry 200 may include CLKOUT_EN_as further described below.

Clock control circuitry 200 may further include a register 208 coupled to the command detection circuitry 202 for assuring valid commands and avoiding potential race conditions. Register 208 may avoid race conditions by ensuring CLKOUT_EN_is low for a minimum of two preclock pulses for every active command. The operation of register 208 will be apparent to one of ordinary skill in the art and, thus, will not be further elaborated herein. Clock control circuitry 200 may further include delay circuitry 216 to adjust the timing of input clock signal CLKPDQ_relative to delays caused by the burst detection circuitry 204.

Burst detection circuitry 204 may include optional bypass circuitry 210 to disable the power savings feature of the clock control circuitry 200. Optional bypass circuitry 210 may be a switch (as illustrated) or may be a nonvolatile programmable element such as a fuse or antifuse, or may be a volatile switching element such as a transistor, latch or register, or any other suitable means for disabling the power savings feature of the clock control circuitry 200 of the present invention. Burst detection circuitry 204 may further include spare control circuitry 212 for test modes as known to one of ordinary skill in the art.

Command detection circuitry 202 may be used to decode command signals to determine whether an NOP command has been issued or not. Command detection circuitry 202 may be a 4-input NAND gate 214 for detecting signals on FCMD_<0:3> corresponding to RAS, CAS and WE as described above and chip select (CS). If all four bits or signals of FCMD_<0:3> are high, then an NOP command has been detected. Otherwise, some other active command is present. Other logically equivalent combinations of gates may be substituted for the command detection circuitry 202 illustrated in FIG. 2 and are considered to be within the spirit and scope of the present invention.

Clock control circuitry 200 may be used on any applicable dynamic random access memory (DRAM) memory device, for example and not by way of limitation, a dynamic random access memory (DRAM), double data rate SDRAM (DDR SDRAM), RAMBUS® DRAM (RDRAM®), extended data-out DRAM (EDO DRAM) and fast-page-mode DRAM (FPM DRAM).

Figure 3A:
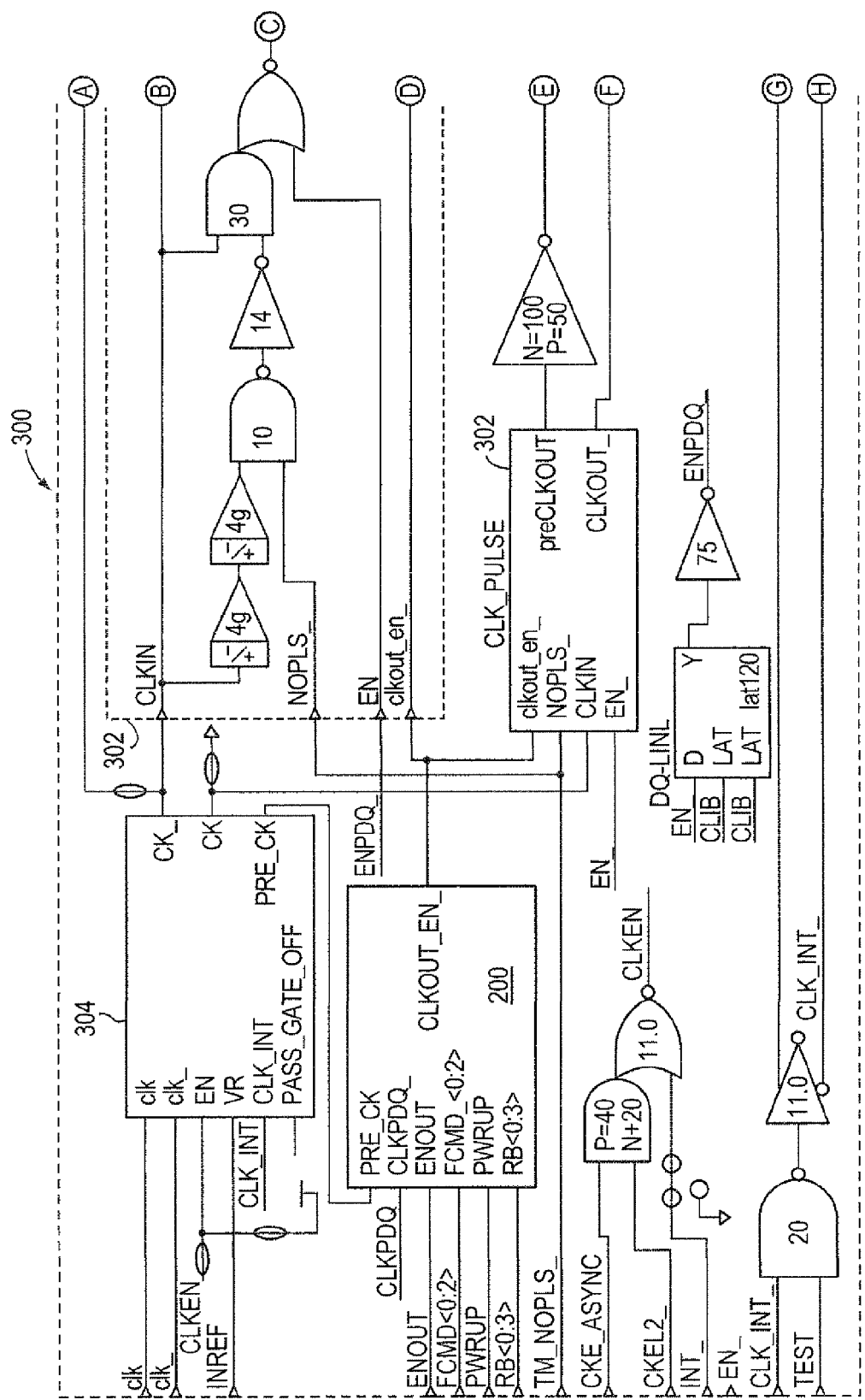
FIGS. 3A-B are schematic diagrams of a clock buffer including clock control circuitry as shown in FIGS. 2A-B according to the present invention.
Figure 3B:
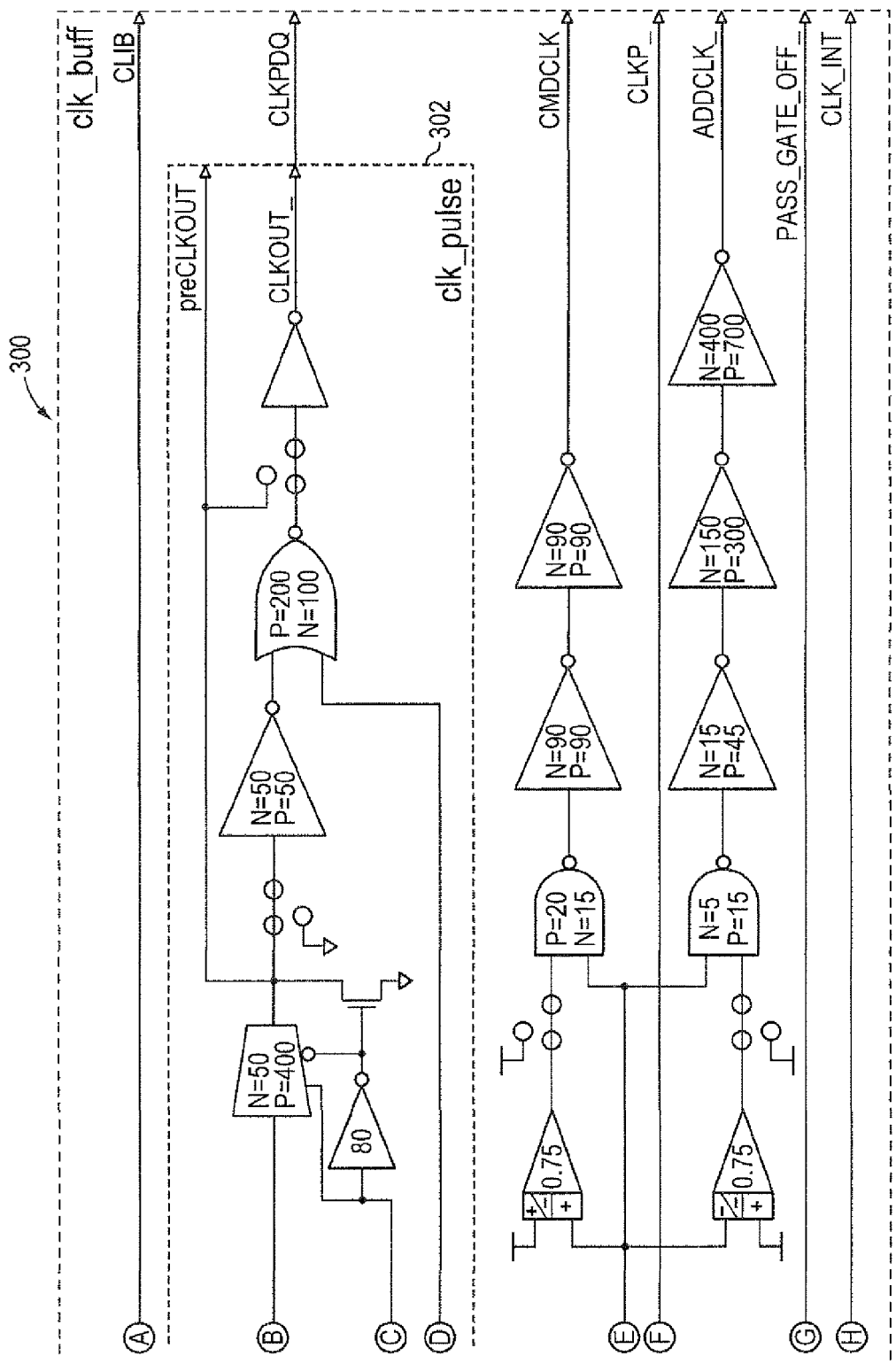

FIG. 3 is a schematic diagram of a clock buffer 300 including clock control circuitry 200 in accordance with the present invention for selectively driving one or more internal clocks derived from a system clock. Clock buffer 300 may also include clock receiving circuitry 304 for receiving an external system clock labeled "clk" in FIG. 3. Clock control circuitry 200 provides CLKOUT_EN_as an active low signal to disable an internal clock when not needed. Clock buffer 300 may further include other circuitry for receiving CLKOUT_EN_and disabling distribution of the external system clock "clk" if CLKOUT_EN_is low. For example, clock buffer 300 may include clock pulse circuitry 302 (labeled "clk_pulse," two of which are shown in FIG. 3) for receiving CLKOUT_EN_and selectively driving or disabling the system clock received on the input signal labeled CLKIN as it is distributed to the output signal labeled CLKOUT to other circuitry (not shown). Clock buffer 300 selectively delivers internal clock signal CLKPDQ in accordance with the state of CLKOUT_EN_. For example, if CLKOUT_EN_is low, then internal clock signal CLKPDQ is output from clock buffer 300, whereas if CLKOUT_EN_is high, internal clock signal CLKPDQ is disabled, thus reducing power consumption. Thus, CLKOUT_EN_is used to enable or disable CLKP_.

Figure 4:
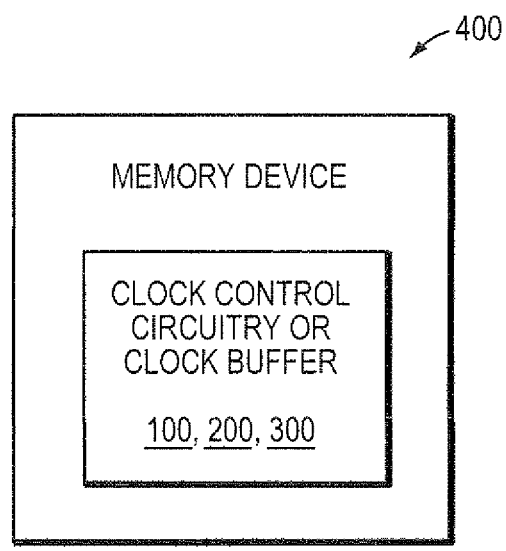
FIG. 4 is a block diagram of a memory device that may include clock control circuitry or a clock buffer according to the present invention.

Clock control circuitry 100 and 200 and clock buffer 300 of the present invention may be used in any higher order digital logic device or IC that may be suitable for reducing power consumption by turning off an internal clock as described herein. For example, FIG. 4 is a block diagram of a memory device 400 that may include clock control circuitry 100 and 200 or clock buffer 300 according to the present invention. Memory device 400 may be, for example and not by way of limitation, a dynamic random access memory (DRAM), double data rate SDRAM (DDR SDRAM), RAMBUS® DRAM (RDRAM®), extended data-out DRAM (EDO DRAM) or fast-page-mode DRAM (FPM DRAM).

Figure 5:
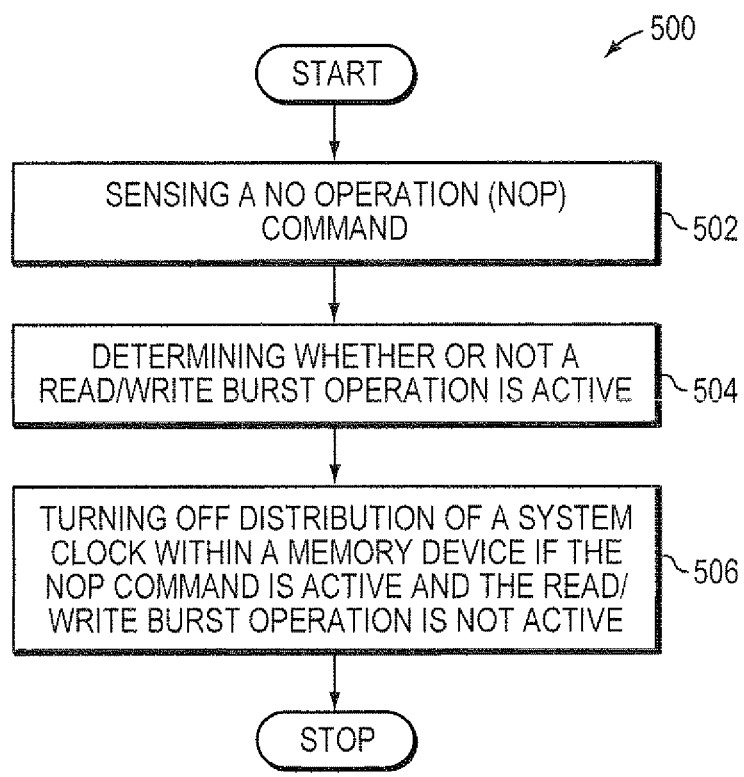
FIG. 5 is a flow chart of a method of reducing power consumption in a memory device in accordance with the present invention.

FIG. 5 is a flow chart of a method 500 of reducing power consumption in a memory device in accordance with the present invention. Method 500 may include sensing 502 a no operation (NOP) command, determining 504 whether or not a read/write burst operation is active and selectively turning off 506 distribution of a system clock within a memory device if the NOP command is active and the read/write burst operation is not active. Sensing 502 an NOP command may include monitoring RAS, CAS, WE and CS signals. Determining 504 whether or not a read/write burst operation is active may include monitoring register burst control and enable out signals.

Figure 6:
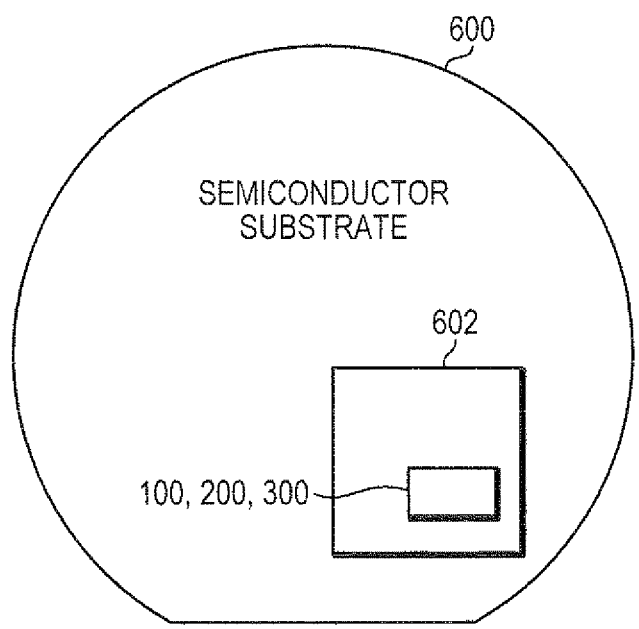
FIG. 6 is a plan view of a semiconductor substrate including at least one IC die having clock control circuitry or a clock buffer of the present invention.

Referring to FIG. 6, a plan view of a semiconductor substrate 600 is shown including at least one IC die 602 (only one of which is shown for clarity). Each IC die 602 may be a memory device 400 including clock control circuitry 100, 200 and/or clock buffer 300 of the present invention. Alternatively, integrated circuit die 602 may be any other integrated circuit that may have an internal clock that may be turned off during idle time in accordance with the present invention. Semiconductor substrate 600 may be a silicon wafer or other large-scale substrate comprising a layer of semiconductor material.

The semiconductor technology employed is not a limiting factor in the application of the circuits and systems of the present invention. While silicon is the preferred bulk semiconductor material for commercial electronic devices, gallium arsenide and indium phosphide substrates may also be employed. Of course, it will be understood that the devices of the present invention may be fabricated on other semiconductor substrates as well, including, for example, silicon-on-glass (SOG) substrates, silicon-on-insulator (SOI) substrates, and silicon-on-sapphire (SOS) substrates.

Figure 7:
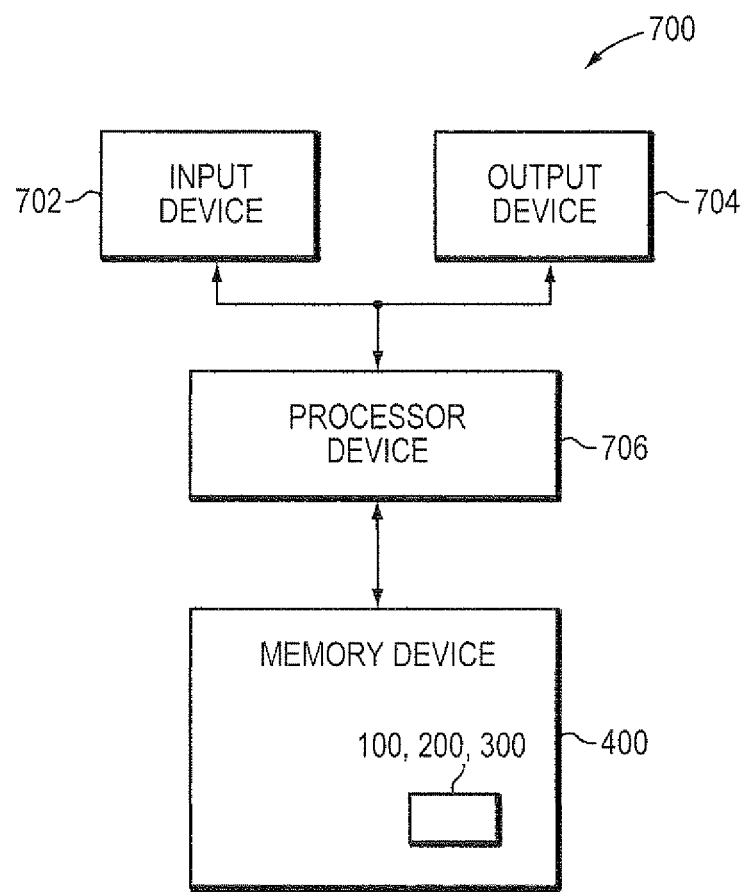
FIG. 7 is a block diagram of a computer system according to the present invention.

FIG. 7 is a block diagram of a computer system 700 in accordance with the present invention. System 700 may include an input device 702, output device 704 and processor 706 in communication with the input device 702 and output device 704. System 700 may further include a memory device 400 including clock control circuitry 100, 200 and/or clock buffer 300 of the present invention.

Although this invention has been described with reference to particular embodiments, the invention is not limited to these described embodiments. The invention is limited only by the appended claims, which include within their scope all equivalent devices or methods that operate according to the principles of the invention as described herein.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A memory device, comprising:
   a memory array; and
   clock control circuitry in communication with the memory array and for receiving a system clock, the clock control circuitry comprising:
      a first circuit element operable to generate a first signal indicating idle time in a memory device;
      a second circuit element operable to generate a second signal indicating an absence of a read/write burst operation; and
      clock gating circuitry operable to selectively gate the system clock in response to a gating signal, the gating signal generated based at least in part on the first signal and the second signal.

2. The memory device of claim 1, wherein the second circuit element comprises a 2-input NOR gate for sensing a read/write burst command.

3. The memory device of claim 1, wherein the clock gating circuitry comprises a 3-input NOR gate.

4. The memory device of claim 3, wherein the 3-input NOR gate is configured to receive:
   the gating signal; and
   one or more delayed clock signals generated by delay circuitry.

5. The memory device of claim 1, wherein the clock control circuitry further comprises delay circuitry for delaying the system clock to compensate for delays caused by one or more of the first circuit element and the second circuit element.

6. The memory device of claim 1, wherein the memory array comprises a dynamic random access memory (DRAM) memory array.

7. The memory device of claim 1, wherein the first circuit element generates the first signal based on one or more of a row-address strobe (RAS) signal, a column-address strobe (CAS) signal, and a write enable (WE) signal.

8. The memory device of claim 1, wherein the first circuit element comprises a 3-input NAND gate operable to receive one or more command signals.

9. Clock control circuitry comprising:
   a first circuit element operable to generate a first signal indicating idle time in a memory device;
   a second circuit element operable to generate a second signal indicating an absence of a read/write burst operation; and
   clock gating circuitry operable to selectively gate a system clock in response to a gating signal, the gating signal generated based at least in part on the first signal and the second signal.

10. The clock control circuitry of claim 9, wherein the second circuit element comprises a 2-input NOR gate for sensing a read/write burst command.

11. The clock control circuitry of claim 9, wherein the clock gating circuitry comprises a 3-input NOR gate.

12. The clock control circuitry of claim 11, wherein the 3-input NOR gate is configured to receive:
   the gating signal; and
   one or more delayed clock signals generated by delay circuitry.

13. The clock control circuitry of claim 9, wherein the clock control circuitry further comprises delay circuitry for delaying the system clock to compensate for delays caused by one or more of the first circuit element and the second circuit element.

14. The clock control circuitry of claim 9, wherein the first circuit element generates the first signal based on one or more of a row-address strobe (RAS) signal, a column-address strobe (CAS) signal, and a write enable (WE) signal.

15. The clock control circuitry of claim 9, wherein the first circuit element comprises a 3-input NAND gate operable to receive one or more command signals.

* * * * *